United States Patent
Hong et al.

(10) Patent No.: US 12,027,517 B2
(45) Date of Patent: Jul. 2, 2024

(54) SEMICONDUCTOR MODULE AND METHOD FOR MANUFACTURING THE SAME

(71) Applicants: HYUNDAI MOTOR COMPANY, Seoul (KR); KIA CORPORATION, Seoul (KR)

(72) Inventors: Jungyeop Hong, Seoul (KR); Dae Hwan Chun, Suwon-si (KR); NackYong Joo, Suwon-si (KR); Youngkyun Jung, Seoul (KR); Junghee Park, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 177 days.

(21) Appl. No.: 17/569,040

(22) Filed: Jan. 5, 2022

(65) Prior Publication Data
US 2023/0020811 A1    Jan. 19, 2023

(30) Foreign Application Priority Data
Jul. 13, 2021  (KR) .................. 10-2021-0091661

(51) Int. Cl.
*H01L 27/06* (2006.01)
*H01L 21/82* (2006.01)
*H01L 21/8258* (2006.01)
*H01L 29/24* (2006.01)

(52) U.S. Cl.
CPC ...... *H01L 27/0688* (2013.01); *H01L 21/8258* (2013.01); *H01L 29/24* (2013.01)

(58) Field of Classification Search
CPC ............ H01L 27/0688; H01L 21/8258; H01L 29/24
USPC ........................................... 257/211
See application file for complete search history.

(56) References Cited

U.S. PATENT DOCUMENTS

2019/0067432 A1* 2/2019 Fujimaki ............ H01L 27/1222

* cited by examiner

*Primary Examiner* — Monica D Harrison
(74) *Attorney, Agent, or Firm* — MCDONNELL BOEHNEN HULBERT & BERGHOFF LLP

(57) ABSTRACT

Disclosed is a semiconductor module including a substrate, a first semiconductor layer positioned on the substrate, an insulator positioned in a partial region on the first semiconductor layer, a second semiconductor layer positioned on the insulator, a first semiconductor device formed on the first semiconductor layer, and a second semiconductor device formed on the second semiconductor layer, wherein one of the first semiconductor layer and the second semiconductor layer includes gallium oxide ($Ga_2O_3$) and the other includes silicon (Si).

19 Claims, 4 Drawing Sheets

SEMICONDUCTOR MODULE AND METHOD FOR MANUFACTURING THE SAME

CROSS REFERENCE TO RELATED APPLICATIONS

This application claims priority to and the benefit of Korean Patent Application No. 10-2021-0091661 filed in the Korean Intellectual Property Office on Jul. 13, 2021, the entire contents of which are incorporated herein by reference.

BACKGROUND

(a) Field

The present disclosure relates to a semiconductor module capable of designing and manufacturing a gallium oxide ($Ga_2O_3$)-based semiconductor and a silicon (Si)-based semiconductor as one device, and a method for manufacturing the same.

(b) Description of the Related Art

A power semiconductor module (or a power module) is to modularize several power semiconductor devices in one package. A type, the number, and specification of the power semiconductor devices inside the power semiconductor module may be changed depending on conditions required by a system. In addition, the power semiconductor devices may be manufactured into various package types according to application fields and system conditions.

The power semiconductor module is widely used as a core component of a converter and an inverter in automobiles, power plants, home appliances, trains, and the like. For example, in order to form a Lorentz force, on which a rotational motion that drives a motor for electric vehicles is based, a three-phase power semiconductor module is used. In other words, the three-phase power semiconductor module controls flow of a current and power injected into the motor. Herein, power semiconductor devices inside the power semiconductor module perform a turn-on/off operation and serve as an electrical switch. The turn-on/off operation of the power semiconductors is commanded and controlled by a gate driver having a control circuit of the power semiconductor module. The power semiconductor module and the gate driver are combined with a cooling component, a controller, other passive elements, and the like, forming the inverter.

The gate driver for commanding and controlling the turn-on/off operation of the power semiconductors inside the power module is in general located outside the power module. As described above, the gate driver basically includes the control circuit for controlling the power module and may be designed to include various functions such as a protection circuit, a temperature sensor, a current sensor, and the like depending on situations. Accordingly, as a wire and a metal line for connecting the power semiconductors and the gate driver is longer, electrical parasitic components (capacitance, inductance) are increased and thus deteriorate switching characteristics, resultantly increasing volumes of the passive devices inside and outside the system.

SUMMARY

An embodiment provides a semiconductor module capable of improving switching characteristics by reducing the electrical parasitic components (capacitance, inductance, etc.), reducing a weight and a volume of components of a system, and increasing the life-span and reliability of a device.

Another embodiment provides a method of manufacturing a semiconductor module.

According to an embodiment, a semiconductor module includes a substrate, a first semiconductor layer positioned on the substrate, an insulator located in a partial region on the first semiconductor layer, a second semiconductor layer positioned on the insulator, a first semiconductor device formed on the first semiconductor layer, and a second semiconductor device formed on the second semiconductor layer, wherein one of the first semiconductor layer and the second semiconductor layer includes gallium oxide ($Ga_2O_3$) and the other of the first semiconductor layer and the second semiconductor layer includes silicon (Si).

The substrate may include silicon (Si), silicon carbide (SiC), sapphire, gallium nitride (GaN), or gallium oxide ($Ga_2O_3$).

The insulator may include $Al_2O_3$, $SiO_2$, or $HfO_2$.

A thickness of the insulator may range from about 10 nm to about 50 nm.

The first semiconductor device may include the first semiconductor layer and an upper region of the first semiconductor layer is positioned on the first semiconductor layer.

The second semiconductor device may include the second semiconductor layer and an upper region of the second semiconductor layer is positioned on the second semiconductor layer.

The first semiconductor layer or the second semiconductor layer may include a P-type region, an N-type region, or both regions in a partial region of the semiconductor layer.

The first semiconductor layer or the second semiconductor layer may be formed by stacking two or more epitaxial layers having different impurity concentrations.

The first semiconductor layer or the second semiconductor layer may be formed by stacking two or more layers selected from a buffer layer, an N-type epitaxial layer, an $N^-$-type epitaxial layer, and an $N^+$-type epitaxial layer.

The upper region of the first semiconductor layer or the upper region of the second semiconductor layer may include a metal layer, an insulating layer, or a combination thereof.

The first semiconductor device and the second semiconductor device may be electrically connected by a wire or a metal line.

The first semiconductor device may include a control element, a temperature sensor, a current sensor, a protection circuit, or a combination thereof.

The control element may include a capacitor, a resistor, an inductor, a CMOS, a field effect transistor (MOSFET), a bipolar junction transistor (BJT), a diode, or a combination thereof.

The second semiconductor device may be a power semiconductor device.

The second semiconductor device may include a field effect transistor (MOSFET), an insulated gate bipolar transistor (IGBT), a bipolar junction transistor (BJT), a Schottky diode, a PN diode, or a combination thereof.

The semiconductor module may further include a protective layer covering the first semiconductor device and the second semiconductor device.

According to another embodiment, a method of manufacturing a semiconductor module includes forming a first semiconductor layer on a substrate, forming an insulator in a partial region on the first semiconductor layer, forming a second semiconductor layer on the insulator, forming a first semiconductor device on the first semiconductor layer, and forming a second semiconductor device on the second semiconductor layer, wherein one of the first semiconductor layer and the second semiconductor layer includes gallium oxide ($Ga_2O_3$) and the other includes silicon (Si).

The forming of the insulator and the second semiconductor layer may include forming an insulator on the first semiconductor layer, forming a first mask on a partial region of the insulator, forming a second semiconductor layer on the insulator and the first mask, removing the first mask and the second semiconductor layer formed on the first mask to expose the insulator, forming a second mask on the second semiconductor layer, and removing the exposed insulator and the second mask.

The method of manufacturing the semiconductor module may further include forming a protective layer covering the first semiconductor device and the second semiconductor device.

The method of manufacturing the semiconductor module may further include electrically connecting the first semiconductor device and the second semiconductor device through a wire.

The method of manufacturing the semiconductor module may further include forming via holes from the upper end of the protective layer to the upper end of the first semiconductor device and the upper end of the second semiconductor device, respectively, and then filling the via holes with a metal to electrically connect the first semiconductor device and the second semiconductor device.

In the semiconductor module according to an embodiment, by optimizing and minimizing the length of a wire and a metal line for electrical connection, electrical parasitic components (capacitance, inductance, etc.) may be reduced to improve switching characteristics.

Accordingly, in the semiconductor module, a volume of passive devices inside and outside the system may be reduced by increasing a switching speed, and reducing switching energy loss to reduce heat generation, a weight and a volume of cooling parts are reduced by evenly distributing a heating portion according to the operation of the device or by artificially placing main devices that cause heat in a place where heat is emitted smoothly, and a weight and a volume of components of the system may be reduced, the system may be simplified, and the life-span and reliability of the device may be increased by increasing the energy use efficiency.

DETAILED DESCRIPTION

Figure 1:
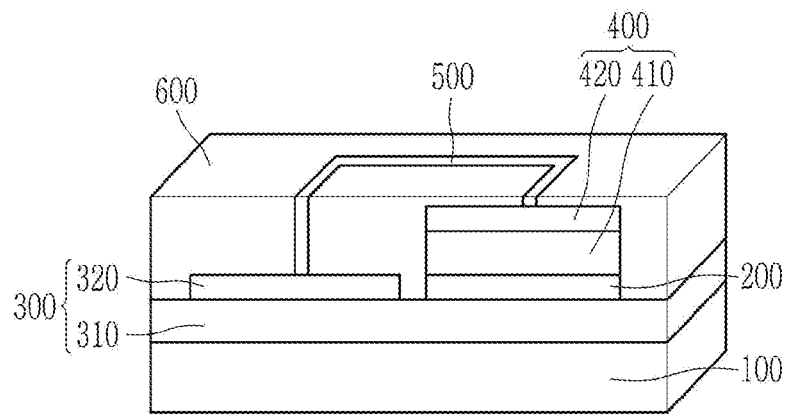
FIG. 1 is a partial cross-sectional perspective view illustrating a semiconductor module according to an embodiment.

The advantages and features of the present disclosure and the methods for accomplishing the same will be apparent from the embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a partial cross-sectional perspective view illustrating a semiconductor module according to an embodiment.

Referring to FIG. 1, the semiconductor module includes a substrate 100, a first semiconductor layer 310 on the substrate 100, an insulator 200 in a partial region on the first semiconductor layer 310, a second semiconductor layer 410 on the insulator 200, a first semiconductor device 300 formed on the first semiconductor layer 310, and a second semiconductor device 400 formed on the second semiconductor layer 410.

The substrate 100 may be a member for growing a thin film such as the first semiconductor layer 310 or the second semiconductor layer 410, and may include silicon (Si), silicon carbide (SiC), sapphire, gallium nitride (GaN), or gallium oxide ($Ga_2O_3$). For example, the sapphire substrate has a small difference in lattice constant from the gallium oxide ($Ga_2O_3$) material, so that a highly crystalline gallium oxide ($Ga_2O_3$) thin film may be manufactured.

On one surface of the substrate 100, the first semiconductor layer 310 is disposed, the insulator 200 is disposed in a partial region on the first semiconductor layer 310, and the second semiconductor layer 410 is disposed on the insulator 200. Herein, the second semiconductor layer 410 is disposed on the insulator 200 alone but not on the first semiconductor layer 310. Accordingly, the second semiconductor layer 410 is disposed on one surface of the first semiconductor layer 310 but spaced apart from each other with the insulator 200 therebetween. In addition, since the other partial region of the first semiconductor layer 310 where the insulator 200 is not disposed is not covered by the insulator 200 and the second semiconductor layer 410, the first semiconductor device 300 may be formed on the first semiconductor layer 310.

In other words, the semiconductor module includes the first semiconductor layer 310 divided into two regions in a horizontal direction and the second semiconductor layer 410. Herein, the horizontal direction is a width direction of the substrate 100, and a vertical direction is a thickness direction of the substrate 100, which is perpendicular to the horizontal direction.

Either one of the first semiconductor layer 310 and the second semiconductor layer 410 includes gallium oxide ($Ga_2O_3$), while the other one includes silicon (Si). In other words, when the first semiconductor layer 310 includes gallium oxide ($Ga_2O_3$), the second semiconductor layer 410 includes silicon (Si), or when the second semiconductor layer 410 includes the gallium oxide ($Ga_2O_3$), the first semiconductor layer 310 includes the silicon (Si).

The gallium oxide and the silicon are heterogeneous materials with different lattice constants and different constituent elements. In general, a gallium oxide layer is grown on a gallium oxide substrate or a sapphire substrate, and a silicon layer having various characteristics is formed on a silicon substrate through a doping process. When silicon- and gallium oxide-based semiconductor devices are implemented on one substrate, it is possible to manufacture a module capable of reducing a power loss and removing an unnecessary connection system, but it is difficult to grow these two devices on one substrate. However, the present disclosure adopts a structure in which the first semiconductor layer 310 and the second semiconductor layer 410 are spaced apart with the insulator 200 therebetween in the vertical direction, so that the first semiconductor layer 310 and the second semiconductor layer 410 on one substrate 100 may respectively include gallium oxide and silicon.

The gallium oxide may be directly deposited as the first semiconductor layer 310 on the substrate 100 or as the second semiconductor layer 410 on the insulator 200. In addition, the silicon may be directly deposited as the first semiconductor layer 310 on the substrate 100 or as the second semiconductor layer 410 on the insulator 200. The second semiconductor layer 410 may have a thickness ranging from about 0.1 μm to about 10 μm.

The insulator 200 is a member needed to distinguish the silicon and the gallium oxide. In particular, when the first semiconductor layer 310 includes the silicon, while the second semiconductor layer 410 includes the gallium oxide, the gallium oxide may be deposited on the insulator 200 into a film with excellent quality, which is insulated from the silicon. The insulator may include $Al_2O_3$, $SiO_2$, $HfO_2$, or the like in order to secure crystallinity during growth of the gallium oxide ($Ga_2O_3$). The insulator may have a thickness of about 10 nm to about 50 nm.

On the first semiconductor layer 310, the first semiconductor device 300 is disposed, and on the second semiconductor layer 410, the second semiconductor device 400 is disposed. For example, the first semiconductor device 300 may be disposed on another partial region of the first semiconductor layer 310 where the insulator 200 is not present, and the second semiconductor device 400 may be disposed on the second semiconductor layer 410 on the insulator 200.

The first semiconductor device 300 may include the first semiconductor layer 310 and an upper region 320 of the first semiconductor layer on the first semiconductor layer 310, and the second semiconductor device 400 may include a second semiconductor layer 410 and an upper region 420 of the second semiconductor layer on the second semiconductor layer 410.

Impurities are injected into the first semiconductor layer 310 or the second semiconductor layer 410. Accordingly, the first semiconductor layer 310 or the second semiconductor layer 410 may include a P-type region, an N-type region, or both of them in a partial region of the first semiconductor layer 310 or the second semiconductor layer 410.

In addition, depending on an injected impurity concentration, the first semiconductor layer 310 or the second semiconductor layer 410 may be formed by stacking two or more epitaxial layers having different impurity concentrations. For example, when the second semiconductor layer 410 includes gallium oxide ($Ga_2O_3$), the second semiconductor layer 410 may be formed by stacking two or more layers selected from a gallium oxide ($Ga_2O_3$)-based buffer layer, an N-type gallium oxide ($Ga_2O_3$) epitaxial layer, an $N^-$-type gallium oxide ($Ga_2O_3$) epitaxial layer, and an $N^+$-type gallium oxide ($Ga_2O_3$) epitaxial layer.

In addition, the first semiconductor layer 310 or the second semiconductor layer 410 may include an insulating layer. The insulating layer may be formed after removing the partial region of the first semiconductor layer 310 or the second semiconductor layer 410 in an etching method and the like.

The upper region 320 of the first semiconductor layer or the upper region 420 of the second semiconductor layer may respectively include the insulating layer, a metal layer, or the like. The first semiconductor device 300 and the second semiconductor device 400 may be electrically connected to each other through the metal layer by a wire or a metal line 500. For example, the metal line 500 may connect them through a via hole. The metal layer may include a material capable of ohmic and Schottky contact, such as Cr, Pt, Pd, Au, Ni, Ag, Cu, Al, Mo, In, Ti, and the like.

For example, the first semiconductor device 300 may include a control element, a temperature sensor, a current sensor, a protective circuit, or a combination thereof. Herein, the first semiconductor layer 310 may include silicon (Si).

For example, when the first semiconductor device 300 is a control element, control element may include an integrated circuit (IC) including a capacitor, a resistor, an inductor, a CMOS, a field effect transistor (MOSFET), a bipolar junction transistor (BJT), a diode, or a combination thereof.

For example, the second semiconductor device 400 may be a power semiconductor device. In this case, the second semiconductor layer 410 may include gallium oxide ($Ga_2O_3$).

For example, the second semiconductor device 400 may include a field effect transistor (MOSFET), an insulated gate bipolar transistor (IGBT), a bipolar junction transistor (BJT), a Schottky diode, a PN diode, or a combination thereof.

Figure 2:
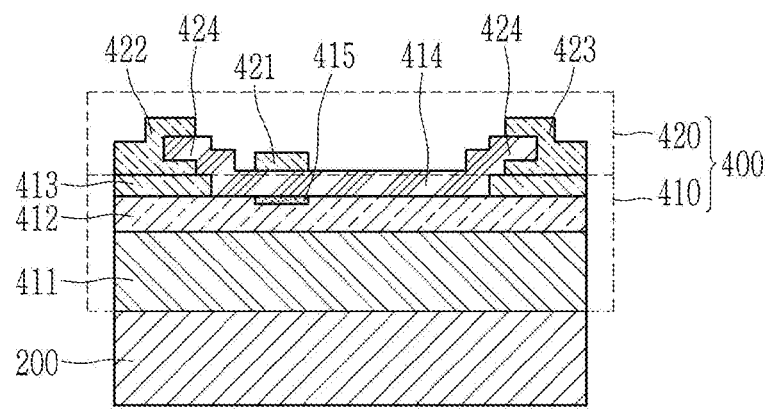
FIG. 2 is a view illustrating an embodiment in which the second semiconductor device is a field effect transistor (MOSFET).

For example, an embodiment in which the second semiconductor device 400 is a field effect transistor (MOSFET) is illustrated in FIG. 2.

Referring to FIG. 2, the second semiconductor device 400 that is a field effect transistor includes a second semiconductor layer 410 and an upper region of the second semiconductor layer 420.

The second semiconductor layer 410 includes a gallium oxide-based buffer layer 411, an $N^-$-type gallium oxide epitaxial layer 412, and an $N^+$-type gallium oxide epitaxial layer 413, and a first insulating layer 414 is included in a partial region of the $N^+$-type gallium oxide epitaxial layer 413. In addition, the second semiconductor layer 410 includes a P-type region 415 disposed in a partial region of the $N^-$-type gallium oxide epitaxial layer 412 under the first insulating layer 414.

The upper region 420 of the second semiconductor layer includes a gate electrode 421 overlapped with the P-type region 415 on the first insulating layer 414 of the second semiconductor layer 410, a source electrode 422 and a drain electrode 423 on the $N^-$-type gallium oxide epitaxial layer 412 of the second semiconductor layer 410, and a second insulating layer 424 disposed between the gate electrode 421 and the source electrode 422 or the drain electrode 423.

Figure 3:
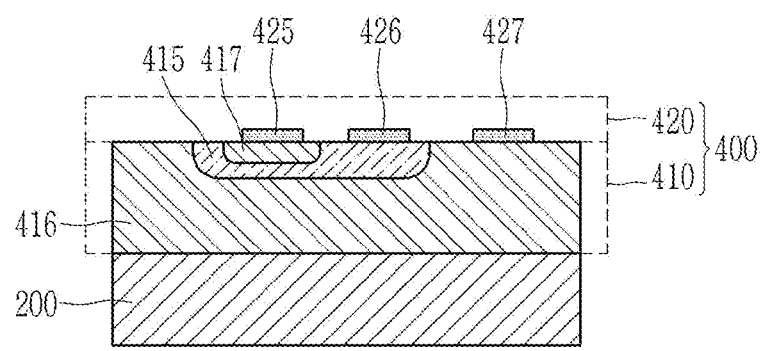
FIG. 3 is a view illustrating an embodiment in which the second semiconductor device is a bipolar junction transistor (BJT).

For example, FIG. 3 shows a case that the second semiconductor device 400 is a bipolar junction transistor (BJT).

Referring to FIG. 3, the second semiconductor device 400, which is a bipolar junction transistor, includes the second semiconductor layer 410 and the upper region 420 of the second semiconductor layer.

The second semiconductor layer 410 includes an N-type gallium oxide epitaxial layer 416, a P-type region 415 in a partial region of an N-type gallium oxide epitaxial layer 416, and an N-type region 417 in a partial region of the P-type region 415.

The upper region 420 of the second semiconductor layer includes an emitter electrode 425 disposed on the N-type region 417, a base electrode 426 disposed on the P-type region 415, and a collector electrode 427 disposed on the N-type gallium oxide epitaxial layer 416.

Figure 4:
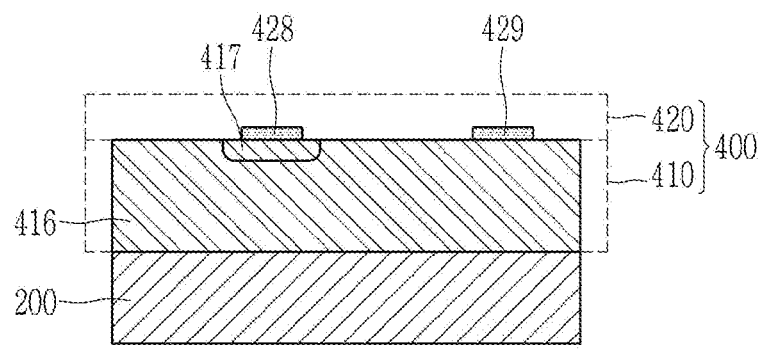
FIG. 4 is a view illustrating an embodiment in which the second semiconductor device is a Schottky diode.

For example, FIG. 4 shows a case that the second semiconductor device 400 is a Schottky diode.

Referring to FIG. 4, the second semiconductor device 400, which is a Schottky diode, includes the second semiconductor layer 410 and the upper region 420 of the second semiconductor layer.

The second semiconductor layer 410 includes the N-type gallium oxide epitaxial layer 416 and the N-type region 417 disposed in a partial region of the N-type gallium oxide epitaxial layer 416.

The upper region 420 of the second semiconductor layer includes a cathode 428 disposed on the N-type region 417 and an anode 429 disposed on the N-type gallium oxide epitaxial layer 416.

A semiconductor module may further include a protective layer 600 further covering the first semiconductor device 300 and the second semiconductor device 400. The protective layer 600 may include a photoresist or oxide. The protective layer 600 may include a via hole for electrically connecting the first semiconductor device 300 and the second semiconductor device 400.

In this way, in the semiconductor module, a power semiconductor based on a gallium oxide ($Ga_2O_3$) material, which is an UWBG (Ultra-Wide Band Gap) material, and a control element such as a silicon (Si)-based gate driver may be manufactured into a single device rather than separate devices.

Accordingly, in the semiconductor module, by optimizing and minimizing the length of a wire and a metal line for electrical connection, electrical parasitic components (capacitance, inductance, etc.) may be reduced to improve switching characteristics.

Accordingly, in the semiconductor module, a volume of passive devices inside and outside the system may be reduced by increasing a switching speed, and reducing switching energy loss to reduce heat generation, a weight and a volume of cooling parts are reduced by evenly distributing a heating portion according to the operation of the device or by artificially placing main devices that cause heat in a place where heat is emitted smoothly, and a weight and a volume of components of the system may be reduced, the system may be simplified, and the life-span and reliability of the device may be increased by increasing the energy use efficiency.

FIGS. 5 to 10 are views sequentially illustrating a method of manufacturing a semiconductor module according to another embodiment.

Referring to FIGS. 5 to 10, a method of manufacturing the semiconductor module includes forming a first semiconductor layer 310 on a substrate 100, forming an insulator 200 in a partial region on the first semiconductor layer 310, forming a second semiconductor layer 410 on the insulator 200, forming a first semiconductor device 300 on the first semiconductor layer 310, and forming a second semiconductor device 400 on the second semiconductor layer 410. Herein, either one of the first semiconductor layer 310 and the second semiconductor layer 410 includes gallium oxide ($Ga_2O_3$), while the other one may include silicon (Si).

Figure 5:
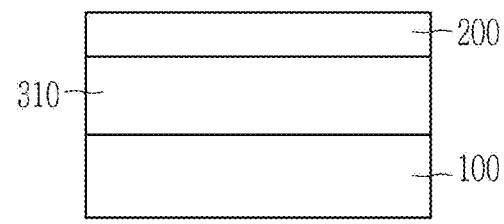
FIGS. 5, 6, 7, 8, 9, and 10 are cross-sectional views sequentially illustrating a method of manufacturing a semiconductor module according to another embodiment.

Referring to FIG. 5, the first semiconductor layer 310 is formed on the substrate 100, and the insulator 200 is formed on the first semiconductor layer 310. The first semiconductor layer 310 may include gallium oxide ($Ga_2O_3$) or silicon (Si). Herein, an example that the first semiconductor layer 310 includes silicon (Si) is illustrated.

Figure 6:
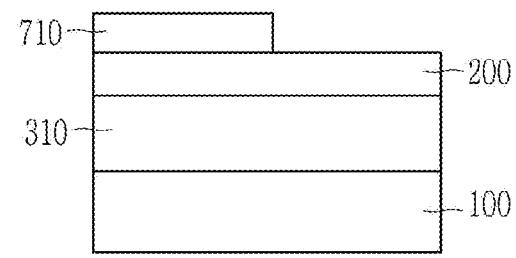
Figure 7:
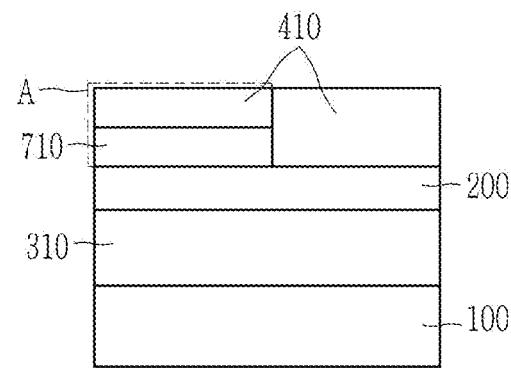

Referring to FIGS. 6 and 7, after forming a first mask 710 on a partial region of the insulator 200, the second semiconductor layer 410 is formed on the insulator 200 and the first mask 710. The first mask 710 may include a photoresist or oxide, and the second semiconductor layer 410 may include gallium oxide ($Ga_2O_3$) or silicon (Si). Herein, a case that the second semiconductor layer 410 is gallium oxide ($Ga_2O_3$) is illustrated.

The second semiconductor layer 410 may be deposited by hydride vapor phase epitaxy (HYPE), pulsed laser deposition (PLD), metal-organic chemical vapor deposition (MOCVD), or mist-chemical vapor deposition (Mist-CVD) and a deposition thickness of the second semiconductor layer 410 may be about 0.1 μm to about 10 μm.

Subsequently, a region A of FIG. 7, which includes the first mask 710 and the second semiconductor layer 410 formed on the first mask 710, is removed to expose an insulator. For example, the second semiconductor layer 410 formed on the first mask 710 and the first mask 710 may be removed in a lift-off method.

Figure 8:
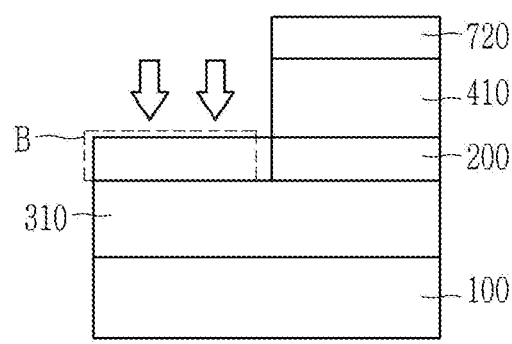

Referring to FIG. 8, a second mask 720 is formed on the second semiconductor layer 410, and then, a region B, which is the exposed insulator 200 and the second mask 720, is removed. The second mask 720, like the first mask 710, may include a photoresist or oxide. The insulator 200 may be removed through dry etching or wet etching.

Figure 9:
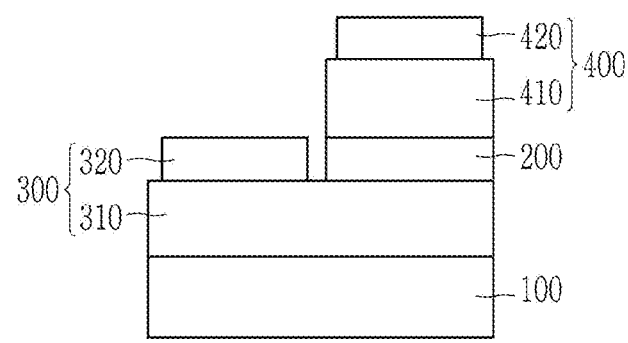
Figure 10:
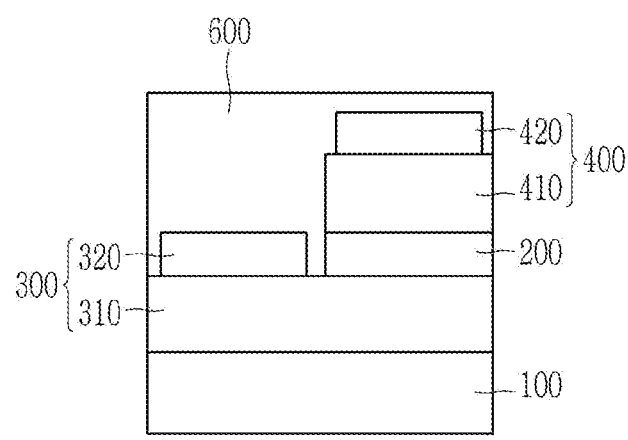

Referring to FIGS. 9 and 10, the first semiconductor device 300 may be formed on the first semiconductor layer 310, the second semiconductor device 400 may be formed on the second semiconductor layer 410, and a protective layer 600 may be formed on the first semiconductor device 300 and the second semiconductor device 400 to cover the first semiconductor device 300 and the second semiconductor device 400.

Herein, the first semiconductor device 300 and the second semiconductor device 400 are first electrically connected through a wire, and then, a protective layer 600 may be formed on the first semiconductor device 300 and the second semiconductor device 400.

Or, after forming the protective layer 600 and then, via holes extending from the upper end of the protective layer 600 to each upper end of the first semiconductor device 300 and the second semiconductor device 400 are formed, and in the via holes, a metal is filled to form a metal line 500 electrically connecting the first semiconductor device 300 with the second semiconductor device 400.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

The invention claimed is:

1. A semiconductor module, comprising:
a substrate,
a first semiconductor layer positioned on the substrate,
an insulator located in a partial region directly on the first semiconductor layer in a vertical direction,
a second semiconductor layer positioned directly on the insulator in a vertical direction,
a first semiconductor device formed on the first semiconductor layer; and
a second semiconductor device formed on the second semiconductor layer,
wherein one of the first semiconductor layer and the second semiconductor layer includes gallium oxide (Ga2O3) and the other of the first semiconductor layer and the second semiconductor layer includes silicon (Si); and
wherein the second semiconductor layer is positioned on the first semiconductor layer in a vertical direction; and
wherein the insulator is positioned between the first semiconductor layer and the second semiconductor layer in a vertical direction.

2. The semiconductor module of claim 1, wherein the substrate comprises silicon (Si), silicon carbide (SiC), sapphire, gallium nitride (GaN), or gallium oxide (Ga2O3).

3. The semiconductor module of claim 1, wherein the insulator comprises Al2O3, SiO2, or HfO2.

4. The semiconductor module of claim 1, wherein a thickness of the insulator ranges about 10 nm to about 50 nm.

5. The semiconductor module of claim 1, wherein the first semiconductor device comprises the first semiconductor layer, and an upper region of the first semiconductor layer is positioned on the first semiconductor layer; and the second semiconductor device comprises the second semiconductor layer, and an upper region of the second semiconductor layer is positioned on the second semiconductor layer.

6. The semiconductor module of claim 5, wherein the first semiconductor layer upper region or the second semiconductor layer upper region comprises a metal layer, an insulating layer, or a combination thereof.

7. The semiconductor module of claim 1, wherein the first semiconductor layer or the second semiconductor layer comprises a P-type region, an N-type region, or both regions in a partial region of the semiconductor layer.

8. The semiconductor module of claim 1, wherein the first semiconductor layer or the second semiconductor layer is formed by stacking two or more epitaxial layers having different impurity concentrations.

9. The semiconductor module of claim 8, wherein the first semiconductor layer or the second semiconductor layer is formed by stacking two or more layers selected from a buffer layer, an N-type epitaxial layer, an N--type epitaxial layer, and an N+-type epitaxial layer.

10. The semiconductor module of claim 1, wherein the first semiconductor device and the second semiconductor device are electrically connected by a wire or a metal line.

11. The semiconductor module of claim 1, wherein the first semiconductor device comprises a control element, a temperature sensor, a current sensor, a protective circuit, or a combination thereof.

12. The semiconductor module of claim 11, wherein the control element comprises an integrated circuit (IC) including a capacitor, a resistor, an inductor, a CMOS, a field effect transistor (MOSFET), a bipolar junction transistor (BJT), a diode, or a combination thereof.

13. The semiconductor module of claim 1, wherein the second semiconductor device is a power semiconductor device.

14. The semiconductor module of claim 13, wherein the second semiconductor device comprises a field effect transistor (MOSFET), an insulated gate bipolar transistor (IGBT), a bipolar junction transistor (BJT), a Schottky diode, a PN diode, or a combination thereof.

15. The semiconductor module of claim 1, wherein the semiconductor module further comprises a protective layer covering the first semiconductor device and the second semiconductor device.

16. A method of manufacturing a semiconductor module, comprising:
forming a first semiconductor layer on a substrate;
forming an insulator in a partial region on the first semiconductor layer;
forming a second semiconductor layer on the insulator;
forming a first semiconductor device on the first semiconductor layer; and
forming a second semiconductor device on the second semiconductor layer;
wherein one of the first semiconductor layer and the second semiconductor layer comprises gallium oxide (Ga2O3) and the other comprises silicon (Si);
wherein forming the insulator and the second semiconductor layer comprises:
forming an insulator on the first semiconductor layer;
forming a first mask on a partial region of the insulator;
forming a second semiconductor layer on the insulator and the first mask;
removing the first mask and the second semiconductor layer formed on the first mask to expose the insulator;
forming a second mask on the second semiconductor layer; and
removing the exposed insulator and the second mask.

17. The method of claim 16, wherein the method of manufacturing the semiconductor module further comprises forming a protective layer covering the first semiconductor device and the second semiconductor device.

18. The method of claim 17, wherein the method of manufacturing the semiconductor module further comprises forming via holes from the upper end of the protective layer to the upper end of the first semiconductor device and the upper end of the second semiconductor device, respectively, and then filling the via holes with a metal to electrically connect the first semiconductor device and the second semiconductor device.

19. The method of claim 16, wherein the method of manufacturing the semiconductor module further comprises electrically connecting the first semiconductor device and the second semiconductor device through a wire.

* * * * *